(12) United States Patent
Nakae

(10) Patent No.: US 6,801,297 B2
(45) Date of Patent: Oct. 5, 2004

(54) EXPOSURE CONDITION DETERMINATION SYSTEM

(75) Inventor: Akihiro Nakae, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 10 days.

(21) Appl. No.: 10/318,002

(22) Filed: Dec. 13, 2002

(65) Prior Publication Data

US 2004/0008329 A1 Jan. 15, 2004

(30) Foreign Application Priority Data

Jul. 12, 2002 (JP) ........................................ 2002-203512

(51) Int. Cl.[7] ........................ G03B 27/42; G03B 27/52; G03B 27/54
(52) U.S. Cl. ............................. 355/40; 355/53; 355/67
(58) Field of Search ............................. 355/40, 52, 53, 355/55, 56, 67

(56) References Cited

U.S. PATENT DOCUMENTS

| | | | |
|---|---|---|---|
| 5,991,006 A | | 11/1999 | Tsudaka |
| 6,674,516 B2 | * | 1/2004 | Machia et al. ................. 355/77 |
| 6,686,107 B2 | * | 2/2004 | Matsumoto et al. ........... 430/22 |
| 2002/0111038 A1 | * | 8/2002 | Matsumoto et al. ......... 438/763 |
| 2002/0166982 A1 | * | 11/2002 | Kataoka et al. .............. 250/548 |
| 2003/0164932 A1 | * | 9/2003 | Ikuno et al. ................... 355/53 |

FOREIGN PATENT DOCUMENTS

| | | |
|---|---|---|
| JP | 2000-091196 | 3/2000 |
| JP | 2001-358060 | 12/2001 |
| TW | 407291 | 10/2000 |

* cited by examiner

*Primary Examiner*—Rodney Fuller
(74) *Attorney, Agent, or Firm*—Oblon, Spivak, McClelland, Maier & Neustadt, P.C.

(57) ABSTRACT

An exposure condition determination system and method, including a database configured to store a first information about a past exposure; and an exposure condition determination unit configured to determine an exposure condition suitable for a new mask which is newly made, based on said first information stored in said database and a second information about an exposure using said new mask. The first information includes at least one of a) a first mask information about properties of a mask used in said pas exposure; b) a first resist process information about properties of a resist process employed in said past exposure; c) an exposure condition information about an exposure condition employed in said past exposure; and d) a first aligner information about properties of an aligner.

14 Claims, 6 Drawing Sheets

F I G. 3A
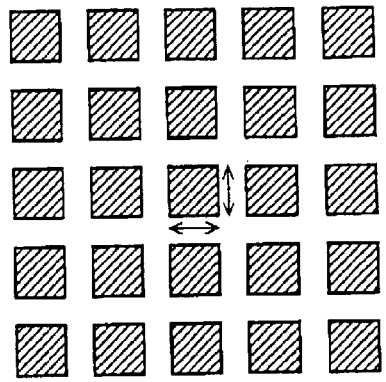
F I G. 3B
F I G. 4
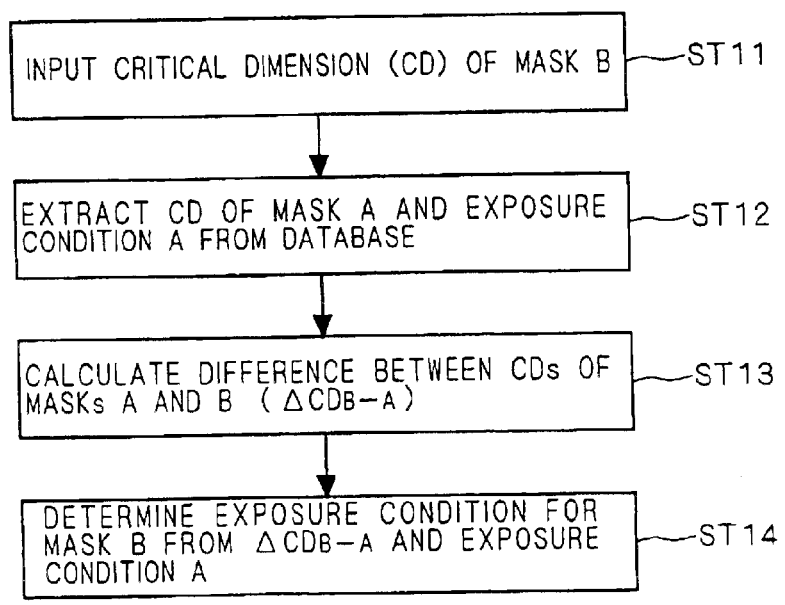

EXPOSURE CONDITION DETERMINATION SYSTEM

BACKGROUND OF THE INVENTION

1. Field of the Invention

The present invention relates to a photolithography technique, and more particularly relates to a technique for determining an exposure condition for a process of an exposure.

2. Description of the Background Art

For a process of an exposure using a photolithography technique in manufacture of semiconductor devices, a mask in which a predetermined pattern is written is employed, for example. FIG. 8 is a flow chart illustrating conventional processes performed before a mask which is newly made using either a new pattern or existing patterns (hereinafter, referred to as a "new mask") is actually applied to manufacture of semiconductor devices in lots. According to the conventional processes, a test exposure which actually employs an aligner is performed every time a new mask is made, in order to determine an exposure condition (an optimum exposure dosage and an optimum focus offset) for using every new mask.

The test exposure includes a manual operation in which an exposure is actually performed using an aligner, which requires much labor. Also, aligners vary in properties such as an aberration thereof. Accordingly, aspects to be considered for determining an exposure condition vary among aligners to be respectively used in conjunction with various new masks, to further complicate processes for determining an exposure condition. As a result, much labor as well as much time has been taken until a mask as made is actually applied to manufacture of semiconductor devices in lots.

SUMMARY OF THE INVENTION

It is an object of the present invention to provide an exposure condition calculation system which eliminates a need of complicated processes for verifying the exposure condition, and makes it possible to obtain an exposure condition determined in accordance with properties of each aligner.

According to the present invention, an exposure condition determination system includes a data base and an exposure condition determination unit. The database stores a first information about a past exposure. The exposure condition determination unit determines an exposure condition suitable for a new mask which is newly made, based on the first information stored in the database and a second information about an exposure using the new mask.

The exposure condition determination unit reflects the first information in determination of an exposure condition. This makes it possible to obtain an exposure condition suitable for the new mask without performing complicated processes for verifying the exposure condition. Further, the first information includes information about properties of an aligner, and the second information includes information indicating an aligner to be employed for the exposure using the new mask. As a result, it is possible to obtain an exposure condition determined in accordance with properties of each aligner.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 3A and 3B illustrate examples of a dense pattern and a sparse pattern in a mask, respectively.

FIG. 4 is a flow chart illustrating operations of the exposure condition determination system according to a first preferred embodiment of the present invention.

DESCRIPTION OF THE PREFERRED EMBODIMENTS

First Preferred Embodiment

An exposure condition is determined by a critical dimension of a mask, an optical condition of an aligner, properties (aberration) of a lens of an aligner, a procedure for processing a resist and features associated therewith (hereinafter referred to as a "resist process"), a reflectance and a step height of a substrate, and the like.

Figure 1:
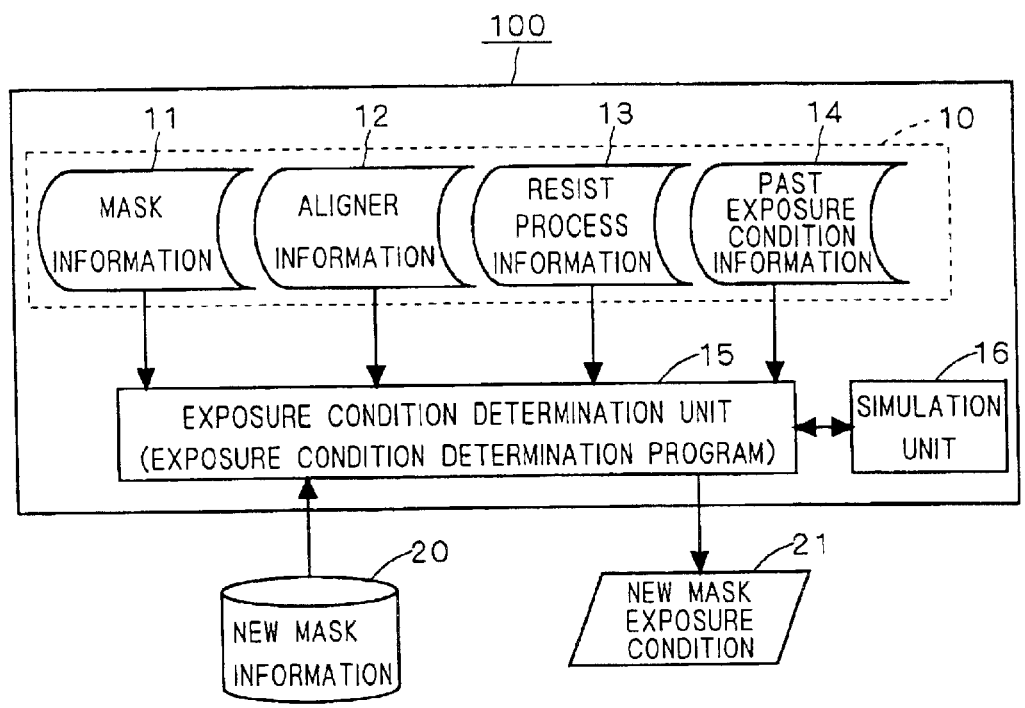
FIG. 1 is a diagrammatic view illustrating an exposure condition determination system according to the present invention.

FIG. 1 is a diagrammatic view illustrating a structure of an exposure condition determination system 100 according to the present invention. The exposure condition determination system 100 includes a database 10, an exposure condition determination unit 15 and a simulation unit 16. The database 10 stores information about exposures performed in the past (past exposures). Such information includes information about masks (mask information) 11, information about aligners (aligner information) 12, information about resist processes, (resist process information) 13 and information about exposure conditions employed in the past (past exposure condition information) 14. Details of each of the foregoing information will be set forth later.

The exposure condition determination system 100 functions to receive information about a new mask which is newly made (new mask information 20) and then to calculate and output an exposure condition suitable for the new mask (a new-mask exposure condition 21).

The new mask information 20 is newly input to be used in determining an exposure condition for the new mask. The new mask information 20 includes information about properties of the new mask such as a critical dimension (CD), a phase difference, a transmittance, a shape and the like. The new mask information 20 further includes information indicating: an aligner, a resist process and an optical condition which are to be employed for an exposure using the new mask; and a target CD (a target value for a dimension of a finished resist to be obtained after an exposure) of the exposure using the new mask. The optical condition includes a numerical aperture (NA) of a lens and an aperture ratio (δ: a ratio of the NA of the lens to an NA of an optical system) to be employed for the exposure using the new mask.

The exposure condition determination unit 15 determines an exposure condition suitable for the new mask in accordance with an exposure condition determination program, based on various information extracted from the database 10 and the new mask information 20, and then outputs a result of the determination which corresponds to the new-mask exposure condition 21. On the other hand, the simulation unit 16 performs an optical simulation or a development simulation using various information extracted from the database 10 and the new mask information 20 by instruction to do so from the exposure condition determination unit 15. A result of the simulation performed by the simulation unit 16 is used for the determination of the new-mask exposure condition 21 in the exposure condition determination unit 15.

Additionally, it is noted that the simulation unit 16 and the exposure condition determination unit 15 are shown as being separate from each other in FIG. 1 for convenience of illustration. However, the exposure condition determination program of the exposure condition determination unit 15 may alternatively be arranged so as to include programs for an optical simulation or a development simulation, so that the exposure condition determination unit 15 can perform an optical simulation or a development simulation.

Below, the respective information stored in the database 10 will be described in detail. The mask information 11 relates to properties of masks made in the past. More specifically, the mask information 11 includes a target critical dimension, an actual critical dimension, a phase difference, a transmittance (a transmittance inherent in a type of a half-tone mask or a transmittance inherent in a type of a binary mask), a shape, a type (a normal type or a Levenson's type) and the like of each of the masks made in the past.

The aligner information 12 relates to properties of aligners. The aligner information 12 includes information about a wavelength, an aberration of a lens and the like of each of the aligners. The information about an aberration of a lens (hereinafter referred to as "aberration information") is associated with properties of a lens which is individually equipped in each of the aligners. In particular, the aberration information contains respective variations of a light intensity and a focus within each lens which are caused due to non-uniformness of the lens.

The resist process information 13 relates to properties of resist processes employed in the past exposures. More specifically, the resist process information 13 includes a type, a film thickness, a solubility parameter, a refractive index, a transmittance, an Eth (an exposure dosage in an aperture) and the like of each of resists employed for the resist processes in the past exposures.

The past exposure condition information 14 relates to exposure conditions which were actually employed in the past exposures (i.e., respective optimum exposure conditions in the past exposures). More specifically, the past exposure condition information 14 includes, for example: respective combinations each of a mask, a resist process and an aligner in the past exposures; respective optimum exposure conditions in the past exposures performed with the respective combinations; respective results of the past exposures performed under the respective optimum exposure conditions (each of the results is represented by a dimension of a finished resist obtained after the exposure, for example). Further, the past exposure condition information 14 includes CD-Exp characteristic curves and CD-Focus characteristic curves to be obtained by test exposures actually performed for determination of an exposure condition. The curves indicate relationships among a change in exposure dosage, a change in focus and a change in dimension of a finished resist. The past exposure condition information 14 also includes a mask error factor (MEF=$\Delta$CD of resist/$\Delta$CD of mask) to be obtained by the test exposures, which is a ratio of an amount of change in resist to an amount of change in mask, and the like. It is noted that each "exposure condition" referred to above includes an optical condition.

Figure 2:
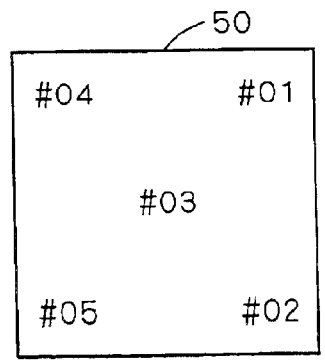
FIG. 2 illustrates a structure of information to be stored in a database.

Each of the mask information 11, the aligner information 12, the resist process information 13 and the past exposure condition information 14 stored in the database 10 is preferably composed of data at a plurality of portions in an area to be irradiated by a single exposure (which area will be hereinafter referred to as a "shot"). As generally known, a light intensity or a focus varies depending on a portion within a shot, under influences of an aberration of a lens and a telecentricity of an aligner. For this reason, it is impossible to appropriately determine an exposure condition merely by using data at one portion in a shot. Thus, it is preferable to use data at a plurality of portions in a shot so as to reflect variations of a light intensity and a focus in a shot in determination of an exposure condition. To this end, each of the mask information 11, the aligner information 12 and the resist process information 13 may be composed of data at five portions #1 through #5 in a shot 50 as illustrated in FIG. 2, for example. Additionally, using data at five portions in a shot is merely one example. Each of the information 11 through 13 may alternatively be composed of data at more than five portions in a shot, which allows for more appropriate determination of an exposure condition.

In employing information composed of data at a plurality of portions in a shot for determination of an exposure condition, it may be advantageous to use an average of values of the data (i.e., numerical representation of the data) at the plurality of portions. This makes it possible to determine an exposure condition without a bias to properties of an exposure performed on a specific portion in a shot.

Alternatively, if a portion where a margin for focus shift and variation in exposure dosage is smaller than that in any other portion in a shot has been previously discovered, it may also be advantageous to use data at such portion. As a result of using the data at such portion, a common margin in an entire shot is increased. For example, in a portion where a resist pattern thinner than that in any other portion, such as a pattern of lines each having a smaller line width, is to be formed, a margin for focus shift and shift and variation in exposure dosage is reduced. To find a portion where a margin for focus shift and variation in exposure dosage is the smallest in a shot, an optical simulation using variations of aberration in a shot and of a critical dimension of a mask can be performed.

Moreover, each of the mask information 11, the aligner information 12, the resist process information 13 and the past exposure condition information 14 is preferably composed of data obtained by monitoring both of a dense pattern as illustrated in FIG. 3A and a sparse pattern as illustrated in FIG. 3B, with respect to a mask pattern, for the following reasons. One reason is that a part of a mask bearing the dense pattern and a part of a mask bearing the sparse pattern may differ from each other in degree of dimensional discrepancy from a target value and in variation of dimensional accuracy within a surface of a mask, due to difference in properties of writing operations of the respective patterns on the mask. Another reason is that a part of a mask bearing the dense pattern and a part of a mask bearing the sparse pattern may differ from each other also in influences exerted thereon by an aberration of an aligner. Further, it is preferable to employ a pattern of the minimum size in a mask, as a pattern to be monitored.

Below, operations of the exposure condition determination system 100 according to the first preferred embodiment will be described. The description will be made on the assumption that a new mask is used in the same environment as provided in a given one of the past exposures. In particular, it is assumed that the same aligner and the same resist process as employed for the given one of the past exposures are employed, and the new mask is in the same condition as a given one of masks used in the past exposures with respect to a transmittance, a phase difference, a pitch in a pattern and the like. FIG. 4 is a flow chart illustrating the operations of the exposure condition determination system 100 to be performed on the foregoing assumption. In the following description, the given one of the masks used in the past exposures will be referred to as a "mask A" and the new mask will be referred to as a "mask B".

First, a user inputs a critical dimension of the mask B as the new mask information 20 into the exposure condition determination unit 15 (ST11). The exposure condition determination unit 15 extracts a critical dimension of the mask A out of the masks used in the past exposures which has the same target critical dimension as that of the mask B, and further extracts an exposure condition provided in using the mask A (exposure condition A), from the mask information 11 in the database 10 (ST12). The exposure condition determination unit 15 also extracts CD-Exp characteristic curves, CD-Focus characteristic curves and an MEF of the mask A from the past exposure condition information 14. At that time, if the masks used in the past exposures include a plurality of masks each having the same target critical dimension as that of the mask B (in other words, a plurality of masks are capable of serving as the mask A), an average of values of respective information (i.e., numerical representation of respective information) of such plurality of masks is employed.

The exposure condition determination unit 15 calculates an amount of discrepancy ($\Delta CD_A$) between an actual critical dimension and the target critical dimension of the mask A and an amount of discrepancy ($\Delta CD_B$) between an actual critical dimension and the target critical dimension of the mask B (ST13). Subsequently, the exposure condition determination unit 15 further calculates a difference ($\Delta CD_{B-A} = \Delta CD_B - \Delta CD_A$) between the respective critical dimensions of the masks A and B (ST13). Then, the exposure condition determination unit 15 determines an exposure condition for the mask B (exposure condition B) based on the $\Delta CD_{B-A}$, the exposure condition A and the CD-Exp characteristic curves and the MEF of the mask A (ST14).

Figure 5A:
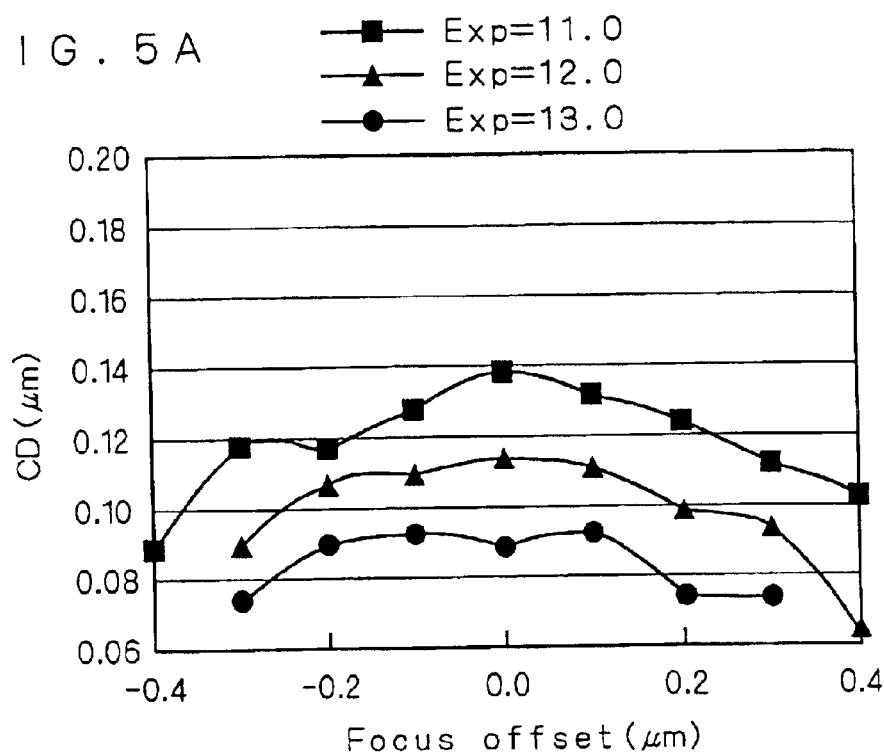
FIGS. 5A and 5B show examples of a CD-Focus characteristic curve and a CD-Exp characteristic curve.

Hereinafter, procedures for determining the exposure condition B performed in the step ST14 will be described. Each CD-Exp characteristic curve depends on a set value of a focus offset which is included in an exposure condition. Hence, the exposure condition determination unit 15 first determines an optimum focus offset based on the CD-Focus characteristic curves of the mask A. Examples of the CD-Focus characteristic curves of the mask A extracted from the past exposure condition information 14 are shown in FIG. 5A, which makes it clear that each CD-Focus characteristic curve depends on an exposure dosage.

In general, as an amount of variation in the CD due to focus shift decreases, a margin for allowing for focus shift increases, thereby to obtain a stable result from an exposure. For this reason, the exposure condition determination unit 15 determines a focus offset around which a gradient of each of the CD-Focus characteristic curves is the slightest, as an optimum focus offset. In an example shown in FIG. 5A, a focus offset of 0.0 μm serves as the optimum focus offset. The exposure condition determination unit 15 extracts one CD-Exp characteristic curve to be obtained when a focus offset is set to the optimum focus offset (0.0 μm), from the CD-Focus characteristic curves of the masks A.

Figure 5B:
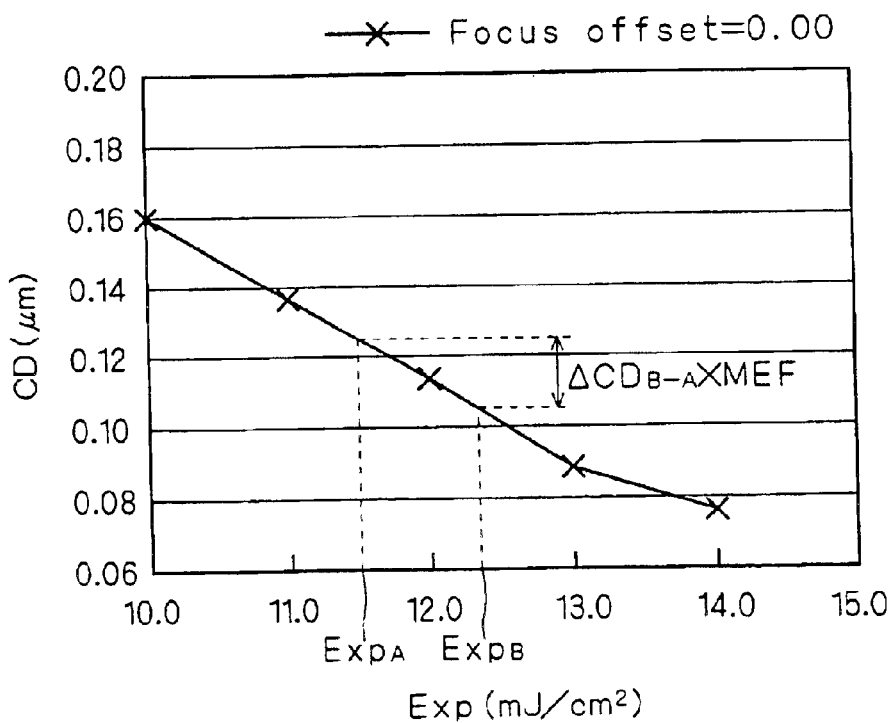

FIG. 5B shows one example of the CD-Exp characteristic curves of the mask A extracted from the past exposure condition information 14. It is noted that for purpose of facilitating the illustration, only one CD-Exp characteristic curve to be obtained when a focus offset is set to the optimum focus offset is shown in FIG. 5B, though a plurality of the CD-Exp characteristic curves varying with respective set values of a focus offset should exist. In the example shown in FIG. 5B, a positive resist is used, in which case the size of the resist decreases with increase of an exposure dosage (Exp).

Each CD-Exp characteristic curve is a graph indicating a relationship of mutual dependence among a resist process, an optical condition and a condition of a mask (a transmittance, a phase difference, a critical dimension, a pitch in a pattern and the like). As noted above, the masks A and B are used in the same environment with respect to a resist process and an optical condition, and the masks A and B are in the same condition. Accordingly, it is possible to calculate an optimum exposure dosage for the mask B based on the CD-Exp characteristic curves of the mask A.

For example, if an optimum exposure dosage for the mask A derived from the optimum focus offset of the exposure condition of the mask A is $Exp_A$ shown in FIG. 5B, an optimum exposure dosage $Exp_B$ for the mask B will be calculated by the following equation which is also shown in FIG. 5B:

$$Exp_B = Exp_A + G \times \Delta CD_{B-A} \times MEF$$

wherein G represents a gradient of the CD-Exp characteristic curve.

As described above, the exposure condition determination system 100 according to the first preferred embodiment includes the database 10 storing the mask information 11, the aligner information 12, the resist process information 13 and the past exposure condition information 14, and the exposure condition determination unit 15 determines an exposure condition for a new mask using the foregoing information. This makes it possible to obtain an exposure condition for a new mask without performing complicated processes for verification of the exposure condition.

Additionally, the above description has been made on the assumption that the CD-Exp characteristic curves, the CD-Focus characteristic curves and the MEF of the mask A are extracted from the past exposure condition information 14. However, the CD-Exp characteristic curves, the CD-Focus characteristic curves and the MEF can be logically calculated by an optical simulation using the mask information 11, the aligner information 12 and the resist process information 13.

Further, FIG. 1 illustrates the structure of the exposure condition determination system 100 as including the simulation unit 16. However, the simulation unit 16 is not necessarily required in the first preferred embodiment, which can be readily appreciated from the above description. In other words, the exposure condition determination system 100 may have a structure which does not include the simulation unit 16.

Moreover, FIG. 1 illustrates the database 10 as storing all of the mask information 11, the aligner information 12, the resist process information 13 and the past exposure condition information 14. However, only the mask information 11 and the past exposure condition information 14 out of the foregoing information 11 through 14 are used for determination of an exposure condition in the first preferred embodiment. Thus, the database 10 may alternatively be arranged so as to store only some of the foregoing information 11 through 14, the mask information 11 and the past exposure condition information 14, for example.

Second Preferred Embodiment

Figure 6:
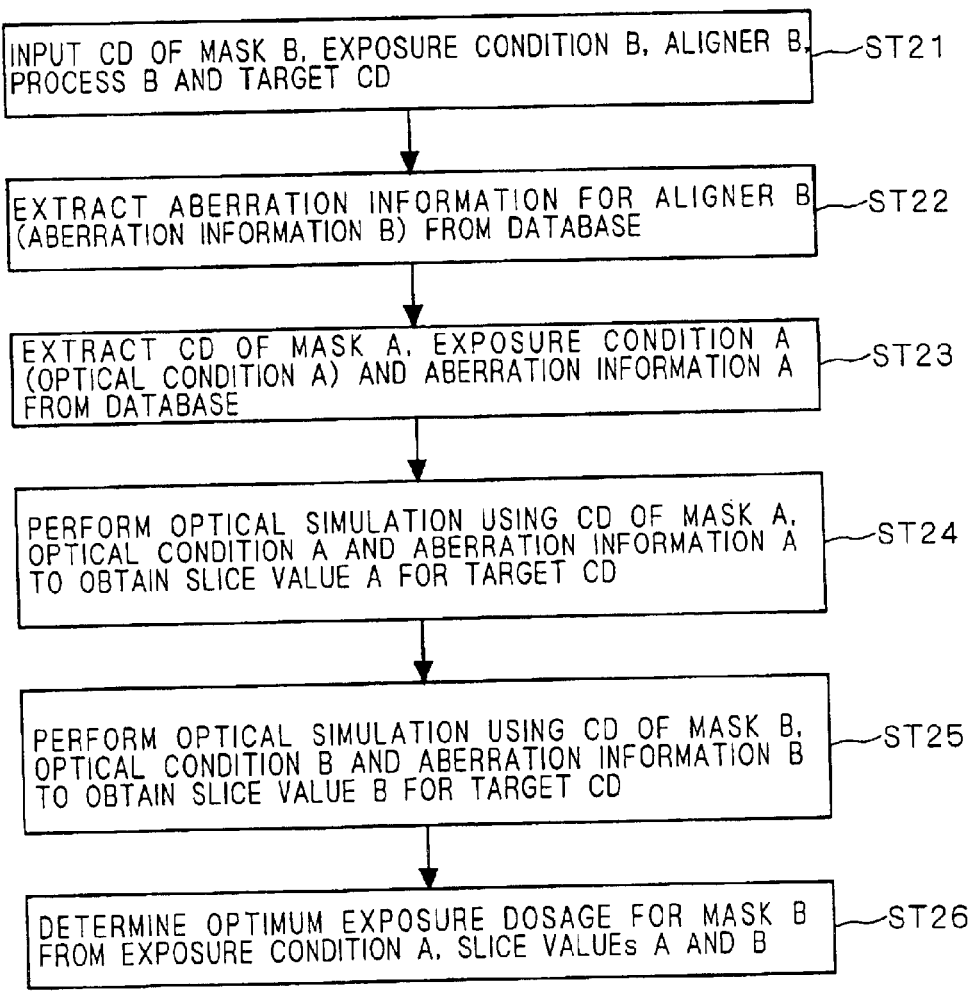
FIG. 6 is a flow chart illustrating operations of the exposure condition determination system according to a second preferred embodiment of the present invention.

In a second preferred embodiment of the present invention, operations of the exposure condition determination system 100 to be performed when respective environments for using the mask A and the mask B are identical to each other with respect to a resist process, but different from each other with respect to an aligner to be employed. FIG. 6 is a flow chart illustrating the operations of the exposure condition determination system 100 in the foregoing instance.

First, a user inputs, as new mask information, a critical dimension of the mask B for which an exposure condition is to be determined, an aligner (aligner B) and an optical condition (optical condition B) which are to be employed for an exposure using the mask B, and a target critical dimension of the mask B, into the exposure condition determination unit 15 (ST21). The exposure condition determination unit 15 extracts from aberration information for the aligner B (aberration information B) from the aligner information 12 in the database 10 (ST22).

The exposure condition determination unit 15 further extracts: a critical dimension of the mask A out of the masks used in the past exposures which has the same target critical dimension of that of the mask B; aberration information for an aligner to be employed for an exposure using the mask A (aberration information A); and an exposure condition which is provided in using the mask A (exposure condition A), from the mask information 11, the aligner information 12 and the past exposure condition information 14, respectively (ST23). The exposure condition A includes information about an optimum exposure dosage and an optical condition provided in using the mask A (optical condition A).

The exposure condition determination unit 15 transmits the critical dimension of the mask A, the optical condition A and the aberration information A to the simulation unit 16. The simulation unit 16 performs an optical simulation using such data transmitted from the exposure condition determination unit 15, and outputs an optical image (optical image A) resulted from the optical simulation, to the exposure condition determination unit 15. The exposure condition determination unit 15 calculates a threshold value (slice value A) for the target CD of the mask B by using the optical image A (ST24).

Subsequently, the exposure condition determination unit 15 transmits the critical dimension of the mask B, the optical condition B and the aberration information B to the simulation unit 16. The simulation unit 16 performs an optical simulation using such data transmitted from the exposure condition determination unit 15, and outputs an optical image (optical image B) resulted from the optical simulation, to the exposure condition determination unit 15. The exposure condition determination unit 15 calculates a threshold value (slice value B) for the target CD of the mask B by using the optical image B (ST25).

Then, the exposure condition determination unit 15 calculates an optimum exposure dosage $Exp_B$ for the mask B from the slice values A and B and an exposure dosage $Exp_A$ actually employed for the mask A (i.e., the optimum exposure dosage in the exposure condition A) (ST26). The dosage $Exp_B$ is calculated from the following equation:

$$Exp_B = Exp_A \times 1/(1+(Sl_A - Sl_B))$$

wherein $Sl_A$ and $Sl_B$ represent the slice values A and B, respectively.

As described above, the exposure condition determination system according to the second preferred embodiment includes the database 10 storing the mask information 11, the aligner information 12, the resist process information 13 and the past exposure condition information 14, and the exposure condition determination unit 15 determines an exposure condition for a new mask using the foregoing information. This makes it possible to obtain an exposure condition for a new mask without performing complicated processes for verification of the exposure condition. Further, according to the second preferred embodiment, an optical simulation using aberration information of an aligner is performed in determining an exposure condition. Accordingly, an exposure condition can be determined in accordance with properties of each aligner.

Moreover, FIG. 1 illustrates the database 10 as storing all of the mask information 11, the aligner information 12, the resist process information 13 and the past exposure condition information 14. However, the resist process information 13 out of the foregoing information 11 through 14 is not used for determination of an exposure condition in the second preferred embodiment. Thus, the database 10 may alternatively be arranged so as to store only some of the foregoing information 11 through 14, the mask information 11, the aligner information 12 and the past exposure condition information 14, for example.

Third Preferred Embodiment

Figure 7:
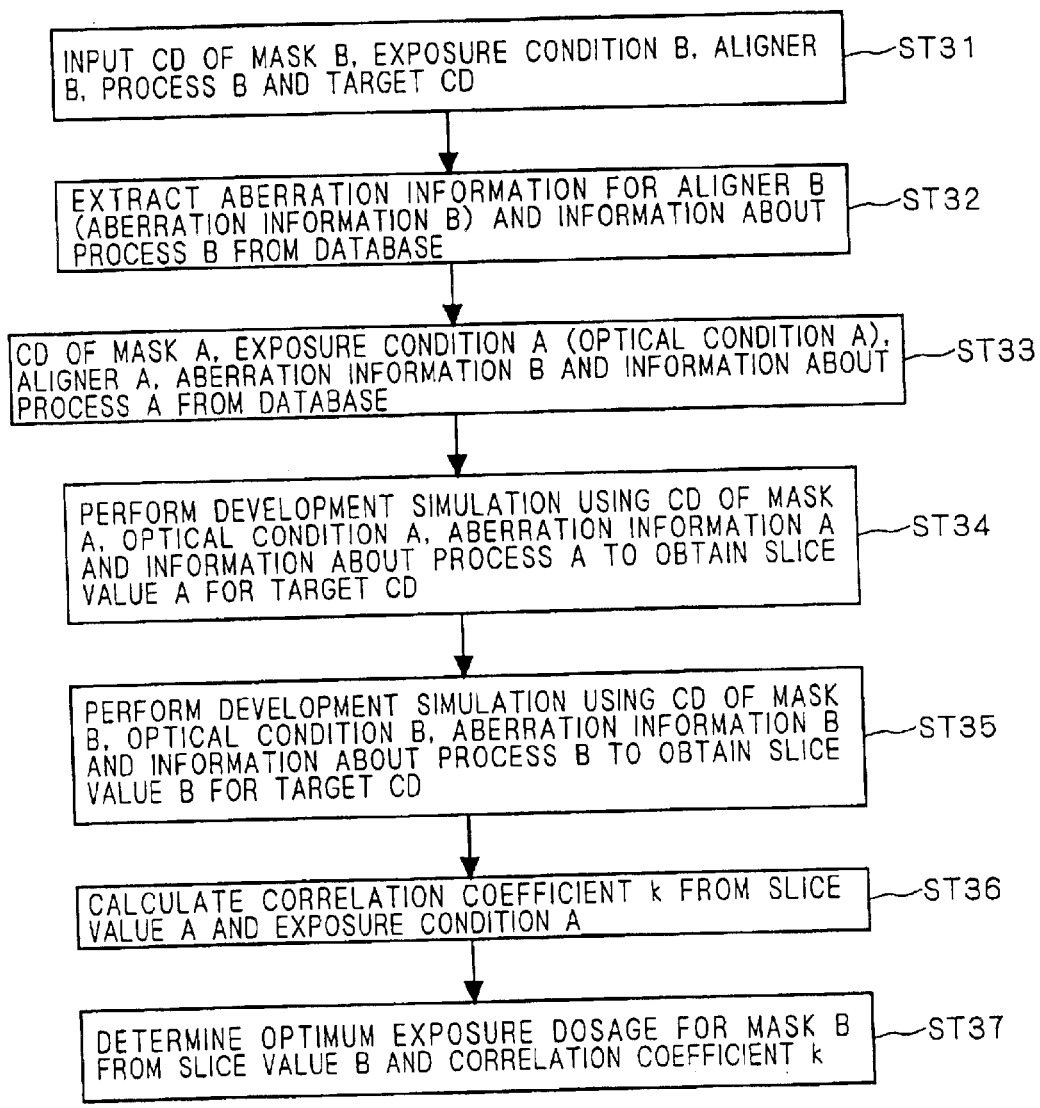
FIG. 7 is a flow chart illustrating operations of the exposure condition determination system according to a third preferred embodiment of the present invention.
Figure 8:
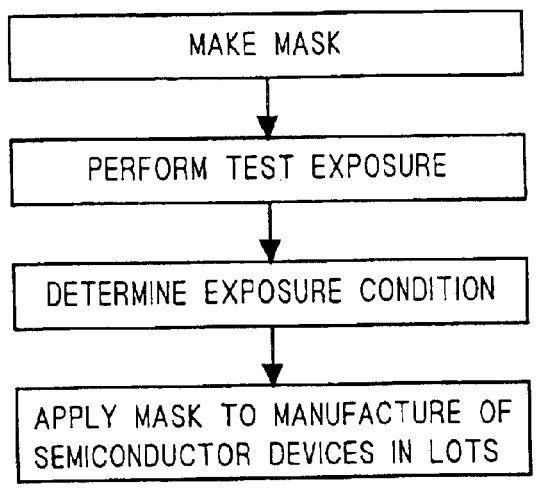
FIG. 8 is a flow chart illustrating conventional processes performed before a new mask is applied to manufacture of semiconductor devices in lot.

In a third preferred embodiment of the present invention, operations of the exposure condition determination system 100 to be performed when the respective environment for using the masks A and B differ from each other in a resist process and an aligner. FIG. 7 is a flow chart illustrating the operations of the exposure condition determination system 100 in the foregoing instance.

First, a user inputs a critical dimension of the mask B for which an exposure condition is to be determined, an aligner (aligner B), an optical condition (optical condition B) and a resist process (process B) which are to be employed for an exposure using the mask B, and a target CD of the mask B (ST31). The exposure condition determination unit 15 extracts aberration information for the aligner B (aberration information B) and information about the process B from the aligner information 12 and the resist process information 13, respectively (ST32).

The exposure condition determination unit 15 further extracts; a critical dimension of the mask A out of the masks used in the past exposures which has the same target CD of that of the mask B; aberration information for an aligner employed for an exposure using the mask A (aberration information A); information about a resist process using the mask A (process A); and an exposure condition provided in using the mask A (exposure condition A), from the mask information 11, the aligner information 12, the resist process information 13 and the past exposure condition information 14, respectively (ST33). The exposure condition A includes information about an optimum exposure dosage and an optical condition provided in using the mask A (optical condition A).

The exposure condition determination unit 15 transmits the critical dimension of the mask A, the optical condition A, the aberration information A and the information about the process A to the simulation unit 16. The simulation unit 16 performs a development simulation using such data transmitted from the exposure condition determination unit 15, and outputs a result of the development simulation, to the exposure condition determination unit 15. It is noted that the development simulation is accomplished by performing the same steps of the optical simulation performed in the second preferred embodiment while providing, as data used therein, additional information about solubility, a film thickness or the like of a resist (i.e., information about a resist process). Then, a dimension of a finished resist pattern which is in accordance with an energy (exposure dosage) as supplied is simulated. The exposure condition determination unit 15 calculates a threshold value (slice value A) for the target CD of the mask B, by using the dimension of the finished resist pattern resulted from the development simulation (ST34). In the instance where the development simulation is performed, a slice value is represented by an exposure dosage.

Subsequently, the exposure condition determination unit 15 transmits the critical dimension of the mask B, the optical condition B, the aberration information B and the information about the process B to the simulation unit 16. The simulation unit 16 performs a development simulation using such data transmitted from the exposure condition determination unit 15, and outputs a result of the development simulation. The exposure condition determination unit 15 calculates a threshold value (slice value B) for the target CD, by using a dimension of a finished resist pattern obtained as the result of the development simulation performed by the simulation unit 16 (ST35).

Then, the exposure condition determination unit 15 calculates an optimum exposure dosage $Exp_B$ for the mask B from the slice values A and B and an exposure dosage $Exp_A$ actually employed for the mask A (i.e., the optimum exposure dosage in the exposure condition A). The dosage $Exp_B$ can be obtained by procedures described as follows.

First, a correlation coefficient k of the dosage $Exp_A$ and an exposure dosage (corresponding to the slice A) which is obtained through the development simulation in the step ST34 is calculated from the following equation (ST36):

$$k=Exp_A/Sl_A$$

wherein $Sl_A$ represents the slice value A. Subsequently, the optimum exposure dosage $Exp_B$ for the mask B is calculated from the following equation using the correlation coefficient k and an exposure dosage (corresponding to the slice value B) which is obtained through the development simulation (ST37):

$$Exp_B=k\times Sl_B$$

wherein $Sl_B$ represents the slice value B.

As described above, the exposure condition determination system according to the third preferred embodiment includes the database 10 storing the mask information 11, the aligner information 12, the resist process information 13 and the past exposure condition information 14, and the exposure condition determination unit 15 determines an exposure condition for a new mask using the foregoing information. This makes it possible to obtain an exposure condition for a new mask without performing complicated processes for verification of the exposure condition. Further, according to the third preferred embodiment, a development simulation using aberration information of an aligner and information about a resist process is performed in determining an exposure condition. Accordingly, an exposure condition can be determined in accordance with properties of each aligner. Moreover, the third preferred embodiment allows for change in a resist process.

Additionally, application of the present invention is not limited to a specific exposure technique. The present invention is applicable to an exposure technique using an I-line or a G-line supplied from a mercury (Hg) lamp, a KrF laser, an ArF Laser, a F2 laser or the like, as well as a process employing a new generation exposure technique such as EPL (Electron Projection Lithography), an X-ray lithography, EUVL (Extreme Ultra Violet Lithography).

Further, in the above-described preferred embodiments, the database 10 is illustrated as storing all of the mask information 11, the aligner information 12, the resist process information 13 and the past exposure condition information 14. However, as noted in the descriptions of the first-to-third preferred embodiments, all of the foregoing information 11 through 14 are not necessarily required. In other words, the database 10 may be arranged so as to store at least one of the mask information 11, the aligner information 12, the resist process information 13 and the past exposure condition information 14, which is arbitrarily chosen as required.

Likewise, the new mask information 20 input into the exposure condition determination system 100 may not include all of information about properties of a new mask, an aligner, a resist process and an optical condition and the like to be employed for an exposure using the new mask. The new mask information 20 may be arranged so as to include at least one of the foregoing information.

While the invention has been shown and described in detail, the foregoing description is in all aspects illustrative and not restrictive. It is therefore understood that numerous modifications and variations can be devised without departing from the scope of the invention.

What is claimed is:

1. An exposure condition determination system, comprising:

a database configured to store a first information about a past exposure; and an exposure condition determination unit configured to determine an exposure condition suitable for a new mask which is newly made, based on said first information stored in said database and a second information about an exposure using said new mask, wherein said first information includes:

a first mask information about properties of a mask used in said past exposure;

a first resist process information about properties of a resist process employed in said past exposure;

an exposure condition information about an exposure condition employed in said past exposure; and a first aligner information about properties of an aligner.

2. The exposure condition determination system according to claim 1, wherein said second information includes:

a second mask information about properties of said new mask;

a second aligner information indicating an aligner to be employed for aid exposure using said new mask;

a second resist process information indicating a resist process to be employed in said exposure using said new mask; and an optical condition information indicating an optical condition to be employed for said exposure using said new mask.

3. The exposure condition determination system according to claim 2,
wherein said exposure condition determination unit is further configured to determine said exposure condition suitable for said new mask based on said first mask information, said exposure condition information and said second mask information.

4. The exposure condition determination system according to claim 2, further comprising:
an optical simulation unit configured to perform an optical simulation using said first and second mask information, said first and second aligner information, said exposure condition information and said optical condition information,
wherein said exposure condition determination unit is further configured to determine said exposure condition suitable for said new mask based on a result of said optical simulation.

5. The exposure condition determination system according to claim 2, further comprising:
a simulation unit configured to perform a development simulation using said first and second mask information, said first and second aligner information, said first and second resist process information, said exposure condition information and said optical condition information,
wherein said exposure condition determination unit is further configured to determine said exposure condition suitable for said new mask based on a result of said development simulation.

6. The exposure condition determination system according to claim 1, wherein
each of said first and second information includes a predetermined information composed of data at a plurality of portions in a shot subjected to a single exposure, and
said exposure condition determination unit is configured to employ an average of values of said data at said plurality of portions as a value of said predetermine information.

7. The exposure condition determination system according to claim 1, wherein
each of said first and second information has a predetermined information composed of data at a plurality of portions in a shot subjected to a single exposure, and
said exposure condition determination unit is further configured to employ by a value of data at a portion out of said plurality of portions where a margin for focus shift and variation in exposure dosage is the smallest in said shot, as a value of said predetermine information.

8. A method for determining an exposure condition, comprising:
storing a first information about a past exposure in a database; and
determining an exposure condition suitable for a new mask which is newly made, based on said first information stored in said database and a second information about an exposure using said new mask, wherein said first information includes:
a first mask information about properties of a mask used in said past exposure;
a first resist process information about properties of a resist process employed in said past exposure;
an exposure condition information about an exposure condition employed in said past exposure; and
a first aligner information about properties of an aligner.

9. The method according to claim 8, wherein said second information includes:
a second mask information about properties of said new mask;
a second aligner information indicating an aligner to be employed for aid exposure using said new mask;
a second resist process information indicating a resist process to be employed in said exposure using said new mask; and
an optical condition information indicating an optical condition to be employed for said exposure using said new mask.

10. The method according to claim 9,
wherein said step of determining an exposure condition includes determining said exposure condition suitable for said new mask based on said first mask information, said exposure condition information, and said second mask information.

11. The method according to claim 9, further comprising:
performing an optical simulation using said first and second mask information, said first and second aligner information, said exposure condition information, an said optical condition information,
wherein said step of determining said exposure condition includes determining said exposure condition based on a result of said optical simulation.

12. The method according to claim 9, further comprising:
performing a development simulation using said first and second mask information, said first and second aligner information, said first and second resist process information, said exposure condition information, and said optical condition information,
wherein said step of determining said exposure condition includes determining said exposure condition based on a result of said development simulation.

13. The method according to claim 8, wherein
each of said first and second information includes a predetermined information composed of data at a plurality of portions in a shot subjected to a single exposure, and
said step of determining said exposure condition includes employing an average of values of said data at said plurality of portions as a value of said predetermine information.

14. The method according to claim 8, wherein
each of said first and second information has a predetermined information composed of data at a plurality of portions in a shot subjected to a single exposure, and
said step of determining said exposure condition includes employing value of data at a portion out of said plurality of portions where a margin for focus shift and variation in exposure dosage is the smallest in said shot, as a value of said predetermined imformation.

* * * * *